United States Patent
Higashitani et al.

(10) Patent No.: US 7,482,223 B2
(45) Date of Patent: Jan. 27, 2009

(54) MULTI-THICKNESS DIELECTRIC FOR SEMICONDUCTOR MEMORY

(75) Inventors: Masaaki Higashitani, Cupertino, CA (US); Tuan Pham, San Jose, CA (US)

(73) Assignee: SanDisk Corporation, Milpitas, CA (US)

(*) Notice: Subject to any disclaimer, the term of this patent is extended or adjusted under 35 U.S.C. 154(b) by 0 days.

(21) Appl. No.: 11/020,402

(22) Filed: Dec. 22, 2004

(65) Prior Publication Data

US 2006/0134864 A1 Jun. 22, 2006

(51) Int. Cl.
*H01L 21/336* (2006.01)

(52) U.S. Cl. .................. 438/257; 438/216; 438/258; 438/264; 438/275; 257/314

(58) Field of Classification Search ........... 438/216, 438/257, 258, 264, 275, 591; 257/314–317
See application file for complete search history.

(56) References Cited

U.S. PATENT DOCUMENTS

| | | | |
|---|---|---|---|
| 5,043,940 A | 8/1991 | Harari | |
| 5,070,032 A | 12/1991 | Yuan et al. | |
| 5,095,344 A | 3/1992 | Harari | |
| 5,168,465 A | 12/1992 | Harari | |
| 5,172,338 A | 12/1992 | Mehrotra et al. | |
| 5,198,380 A | 3/1993 | Harari | |
| 5,268,318 A | 12/1993 | Harari | |
| 5,268,319 A | 12/1993 | Harari | |
| 5,297,148 A | 3/1994 | Harari et al. | |
| 5,313,421 A | 5/1994 | Guterman et al. | |
| 5,315,541 A | 5/1994 | Harari et al. | |
| 5,343,063 A | 8/1994 | Yuan et al. | |
| 5,380,672 A | 1/1995 | Yuan et al. | |
| 5,389,808 A | 2/1995 | Arai | |
| 5,459,091 A | 10/1995 | Hwang | |
| 5,512,505 A | 4/1996 | Yuan et al. | |
| 5,534,456 A | 7/1996 | Yuan et al. | |
| 5,554,553 A | 9/1996 | Harari | |

(Continued)

FOREIGN PATENT DOCUMENTS

DE  196 17 632  7/1997

(Continued)

OTHER PUBLICATIONS

"Planarized NVRAM Cell with Self-Aligned BL-BL and WL-BL Isolations", IBM Technical Disclosure Bulletin, IBM Corp. New York, US, vol. 36, No. 2, Feb. 1, 1993, pp. 375-377.

(Continued)

*Primary Examiner*—Steven Loke
*Assistant Examiner*—David Goodwin
(74) *Attorney, Agent, or Firm*—Vierra Magen Marcus & DeNiro LLP

(57) ABSTRACT

A process provides a gate dielectric layer of a first thickness for a memory array and for certain peripheral circuits on the same substrate as the memory array. High-voltage peripheral circuits are provided with a gate dielectric layer of a second thickness. Low-voltage peripheral circuits are provided with a gate dielectric layer of a third thickness. The process provides protection from subsequent process steps for a gate dielectric layer. Shallow trench isolation allows the memory array cells to be extremely small, thus providing high storage density.

17 Claims, 8 Drawing Sheets

U.S. PATENT DOCUMENTS

| | | | |
|---|---|---|---|
| 5,579,259 A | 11/1996 | Samachisa et al. | |
| 5,595,924 A | 1/1997 | Yuan et al. | |
| 5,640,032 A | 6/1997 | Tomioka | |
| 5,654,217 A | 8/1997 | Yuan et al. | |
| 5,661,053 A | 8/1997 | Yuan | |
| 5,677,872 A | 10/1997 | Samachisa et al. | |
| 5,712,179 A | 1/1998 | Yuan | |
| 5,712,180 A | 1/1998 | Guterman et al. | |
| 5,716,863 A | 2/1998 | Arai | |
| 5,747,359 A | 5/1998 | Yuan et al. | |
| 5,756,385 A | 5/1998 | Yuan et al. | |
| 5,786,988 A | 7/1998 | Harari | |
| 5,817,580 A | 10/1998 | Violette | |
| 5,847,425 A | 12/1998 | Yuan et al. | |
| 5,867,429 A | 2/1999 | Chen et al. | |
| 5,883,409 A | 3/1999 | Guterman et al. | |
| 5,923,976 A | 7/1999 | Kim | |
| 5,965,913 A | 10/1999 | Yuan et al. | |
| 5,966,618 A | 10/1999 | Sun et al. | |
| 5,981,335 A | 11/1999 | Chi | |
| 5,999,448 A | 12/1999 | Kurihara et al. | |
| 6,028,336 A | 2/2000 | Yuan | |
| 6,046,935 A | 4/2000 | Takeuchi et al. | |
| 6,060,360 A | 5/2000 | Lin et al. | |
| 6,103,573 A | 8/2000 | Harari et al. | |
| 6,133,093 A * | 10/2000 | Prinz et al. | 438/257 |
| 6,151,248 A | 11/2000 | Harari et al. | |
| 6,172,395 B1 | 1/2001 | Chen et al. | |
| 6,184,093 B1 | 2/2001 | Sung | |
| 6,208,545 B1 | 3/2001 | Leedy | |
| 6,222,762 B1 | 4/2001 | Guterman et al. | |
| 6,235,586 B1 | 5/2001 | Au et al. | |
| 6,258,665 B1 | 7/2001 | Shimizu et al. | |
| 6,265,308 B1 * | 7/2001 | Bronner et al. | 438/637 |
| 6,281,075 B1 | 8/2001 | Yuan et al. | |
| 6,281,077 B1 | 8/2001 | Patelmo et al. | |
| 6,295,227 B1 | 9/2001 | Sakui et al. | |
| 6,297,097 B1 | 10/2001 | Jeong | |
| 6,326,263 B1 | 12/2001 | Hsieh | |
| 6,365,525 B2 | 4/2002 | Müller | |
| 6,391,722 B1 | 5/2002 | Koh | |
| 6,417,051 B1 * | 7/2002 | Takebuchi | 438/287 |
| 6,417,538 B1 | 7/2002 | Choi | |
| 6,448,126 B1 * | 9/2002 | Lai et al. | 438/216 |
| 6,455,440 B1 | 9/2002 | Jeng | |
| 6,455,889 B2 | 9/2002 | Sakui | |
| 6,465,323 B1 | 10/2002 | Yu et al. | |
| 6,483,146 B2 | 11/2002 | Lee et al. | |
| 6,512,263 B1 | 1/2003 | Yuan et al. | |
| 6,529,410 B1 | 3/2003 | Han et al. | |
| 6,544,431 B2 | 4/2003 | Gill et al. | |
| 6,548,374 B2 | 4/2003 | Chung | |
| 6,559,008 B2 | 5/2003 | Rabkin et al. | |
| 6,562,682 B1 | 5/2003 | Chiu et al. | |
| 6,614,684 B1 | 9/2003 | Shukuri et al. | |
| 6,620,681 B1 | 9/2003 | Kim et al. | |
| 6,680,230 B2 | 1/2004 | Arai et al. | |
| 6,689,653 B1 * | 2/2004 | Seah et al. | 438/201 |
| 6,713,834 B2 | 3/2004 | Mori et al. | |
| 6,762,092 B2 | 7/2004 | Yuan et al. | |
| 6,770,932 B2 | 8/2004 | Himeno et al. | |
| 6,791,142 B2 | 9/2004 | Tseng | |
| 6,794,708 B2 * | 9/2004 | Mori | 257/314 |
| 6,815,755 B2 * | 11/2004 | Colclaser et al. | 257/314 |
| 6,838,357 B2 | 1/2005 | Chen et al. | |
| 6,844,586 B2 | 1/2005 | Ding | |
| 6,853,037 B2 * | 2/2005 | Kudo et al. | 257/369 |
| 6,855,966 B2 | 2/2005 | Chuang et al. | |
| 6,891,246 B2 | 5/2005 | Aritome | |
| 6,897,524 B2 * | 5/2005 | Kamiya | 257/324 |
| 6,908,817 B2 | 6/2005 | Yuan | |
| 6,964,913 B2 * | 11/2005 | Dong et al. | 438/437 |
| 7,011,999 B2 | 3/2006 | Minami et al. | |
| 7,015,101 B2 * | 3/2006 | Zheng et al. | 438/258 |
| 7,023,049 B2 | 4/2006 | Takebuchi et al. | |
| 7,183,153 B2 | 2/2007 | Lutze et al. | |
| 7,323,740 B2 | 1/2008 | Park et al. | |
| 2002/0048897 A1 | 4/2002 | Hong | |
| 2002/0058421 A1 | 5/2002 | Hui et al. | |
| 2002/0072197 A1 | 6/2002 | Kang et al. | |
| 2002/0195647 A1 | 12/2002 | Aritome | 257/315 |
| 2002/0197800 A1 * | 12/2002 | Hashimoto et al. | 438/266 |
| 2003/0015497 A1 | 1/2003 | Gill et al. | |
| 2003/0029839 A1 | 2/2003 | Chou | |
| 2003/0235078 A1 | 12/2003 | Chien et al. | |
| 2004/0012998 A1 | 1/2004 | Chien et al. | |
| 2004/0084713 A1 | 5/2004 | Hsieh | |
| 2004/0126972 A1 | 7/2004 | Dong et al. | |
| 2004/0262670 A1 | 12/2004 | Takebuchi et al. | 257/315 |
| 2005/0023604 A1 * | 2/2005 | Kim et al. | 257/316 |
| 2005/0250342 A1 * | 11/2005 | Ueda | 438/763 |
| 2006/0134845 A1 | 6/2006 | Pham et al. | |

FOREIGN PATENT DOCUMENTS

| | | |
|---|---|---|
| EP | 1274132 | 1/2003 |
| EP | 1363324 | 11/2003 |
| JP | 05190809 | 7/1993 |
| JP | 2001-135736 | 5/2001 |

OTHER PUBLICATIONS

Notification of Transmittal of The International Search Report and The Written Opinion of the International Searching Authority, or the Declaration, corresponding International Application No. PCT/US2005/045992, mailed May 15, 2006, 15 pages.

Lutze et al., "Self Aligned Non-Volatile Memory Cells and Processes for Fabrication", U.S. Appl. No. 10/799,060, filed Mar. 12, 2004, 41 pages.

Pham et al., "Low-Voltage, Multiple Thin-Gate Oxide and Low-Resistance Gate Electrode", U.S. Appl. No. 11/021,693, filed Dec. 22, 2004, 25 pages.

Aritome, Seiichi, "Advanced Flash Memory Technology and Trends for File Storage Application," IEDM Technical Digest, International Electronics Devices Meeting, IEEE, San Francisco, California, Dec. 10-13, 2000, pp. 33.1.1-33.1.4.

Chan, et al., "A True Single-Transistor Oxide-Nitride-Oxide EEPROM Device," *IEEE Electron Device Letters*, vol. EDL-8, No. 3, Mar. 1987, pp. 93-95.

DiMaria et al., "Electrically-alterable read-only-memory using Si-rich $SIO_2$ injections and a floating polycrystalline silicon storage layer," *J. Appl. Phys.* 52(7), Jul. 1981, pp. 4825-4842.

Eitan et al., "NROM: A Novel Localized Trapping, 2-Bit Nonvolatile Memory Cell," *IEEE Electron Device Letters*, vol. 21, No. 11, Nov. 2000, pp. 543-545.

Higashitani et al., "Multi-Thickness Dielectric for Semiconductor Memory", U.S. Appl. No. 11/020,402, filed Dec. 22, 2004, 27 pages.

Hori et al., "A MOSFET with Si-implanted Gate-$SiO_2$ Insulator for Nonvolatile Memory Applications," IEDM 92, Apr. 1992, pp. 469-472.

Lee, Jae-Duk, et al., "Effects of Parasitic Capacitance on NAND Flash Memory Cell Operation," Non-Volatile Semiconductor Memory Workshop, IEEE, Monterey, California, Aug. 12-16, 2001, pp. 90-92.

Nozaki et al., "A 1-Mb EEPROM with MONOS Memory Cell for Semiconductor Disk Application," *IEEE Journal of Solid State Circuits*, vol. 26, No. 4, Apr. 1991, pp. 497-501.

Park et al., "8Gb MLC (Multi-Level Cell) NAND Flash Memory using 63nm Process Technology", Samsung Electronics Co., LTD., Semiconductor R & D Center, pp. 1-4.

Takeuchi, Y., et al., "A Self-Aligned STI Process Integration for Low Cost and Highly Reliable IGbit Flash Memories," 1998 Symposium on VLSI Technology; Digest of Technical Papers, IEEE, Honolulu, Hawaii, Jun. 9-11, 1998, pp. 102-103.

Examination Report dated Jan. 16, 2008, European Patent Application No. 05855071.6.

International Preliminary Report on Patentability dated Jun. 26, 2007, International Patent Application No. PCT/US2005/046448.

Office Action dated Sep. 28, 2005, U.S. Appl. No. 11/021,693.

Office Action dated Sep. 12, 2008, Chinese Patent Application No. 200580042256.8.

Office Action dated Sep. 25, 2008, Korean Patent Application No. 2007-7013280.

* cited by examiner

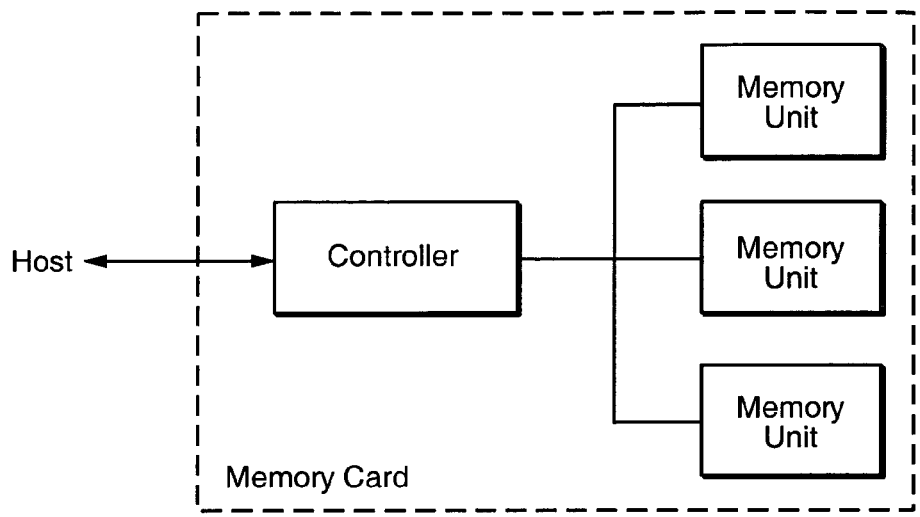
FIG._1
*(PRIOR ART)*
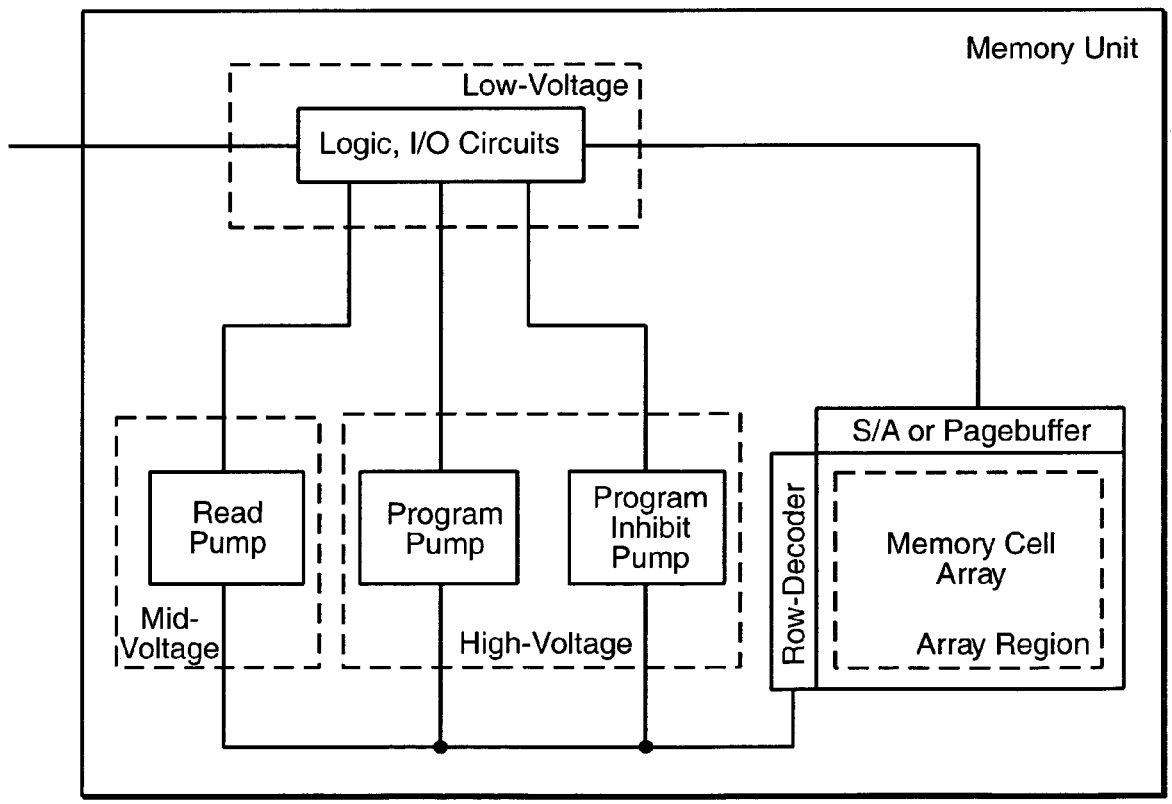
FIG._2
*(PRIOR ART)*

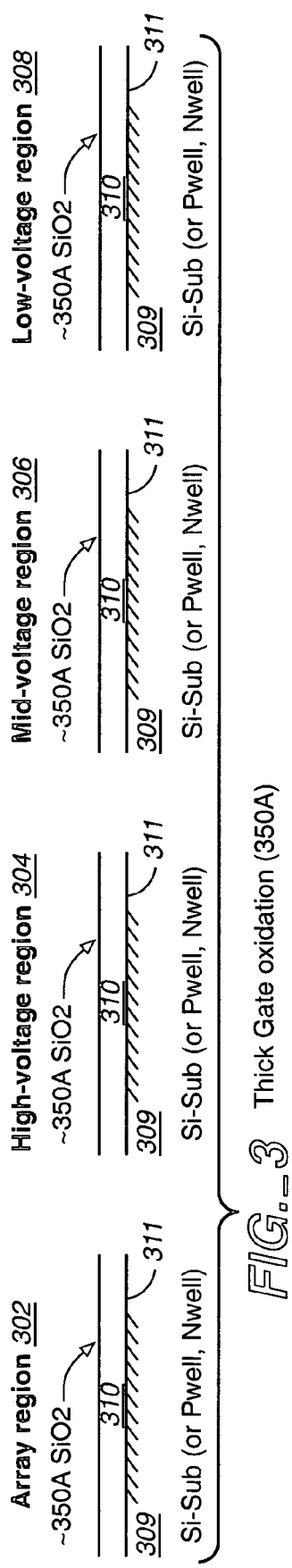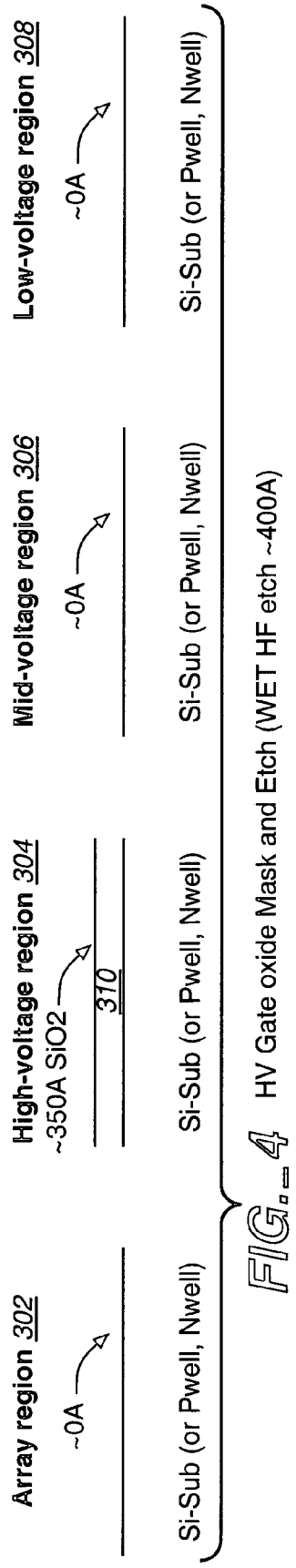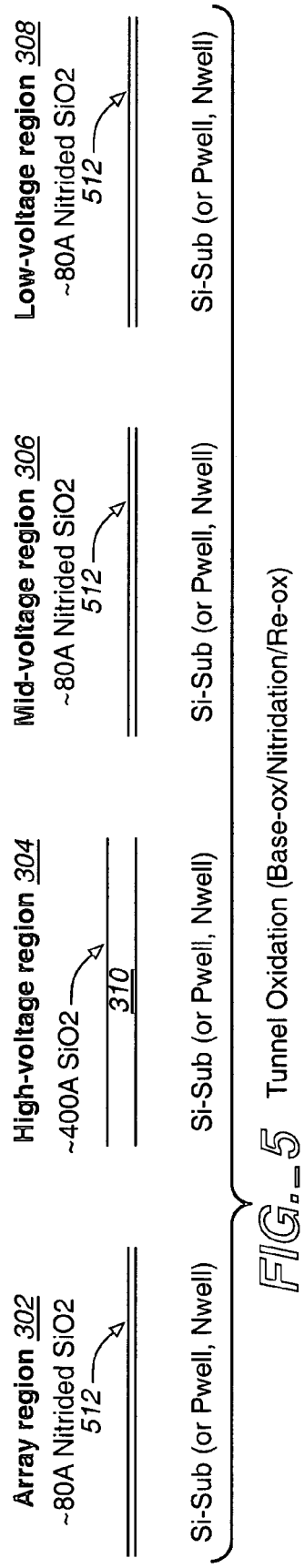

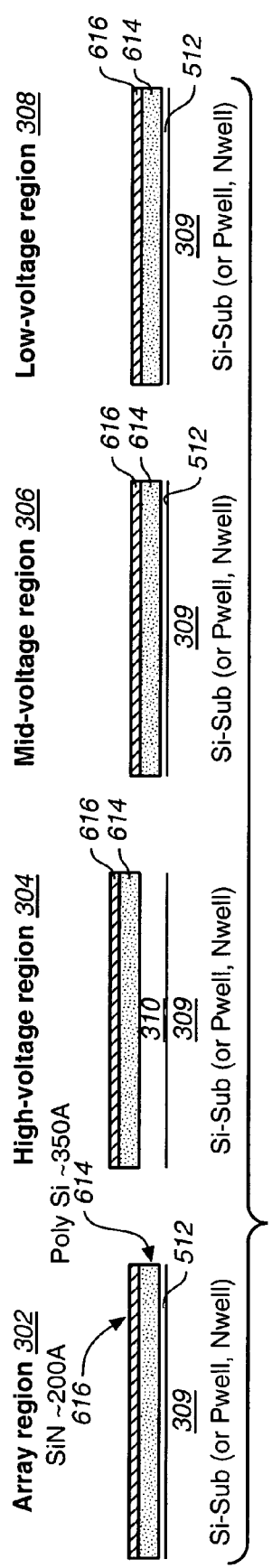
FIG._6 Poly1-1 deposition ~350A (Non-Dope) and SiN deposition (~200A)
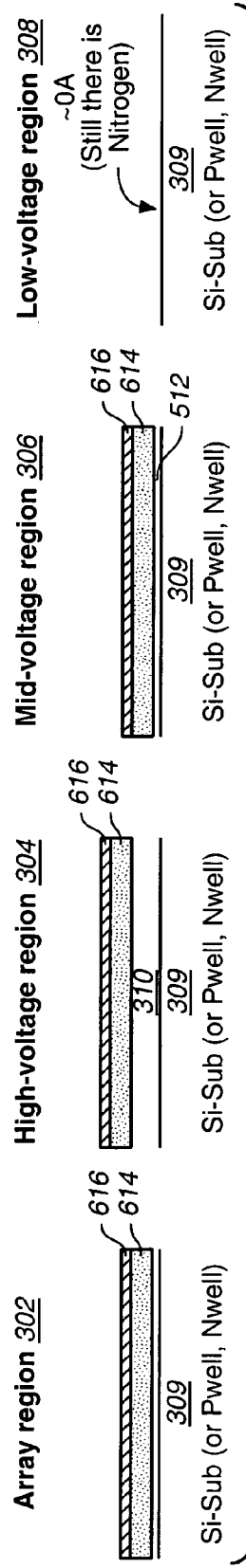
FIG._7 Low Volatge Gate Oxide Mask and Etch (Poly ~350A Dry/SiO2 ~100A Wet HF)
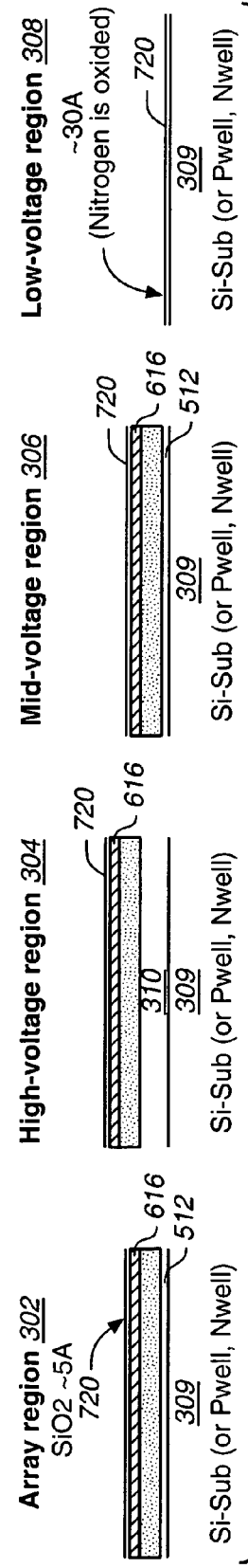
FIG._8 Sacrificial Ox for Low Voltage Gate Oxidation ~40A

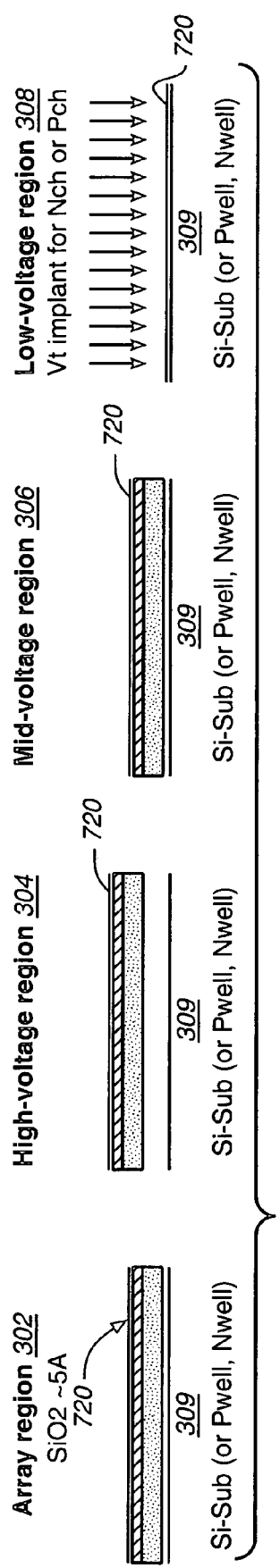
FIG. 9  Vt implant (Nch, Pch) for Low Voltage Gate Oxidation ~40A
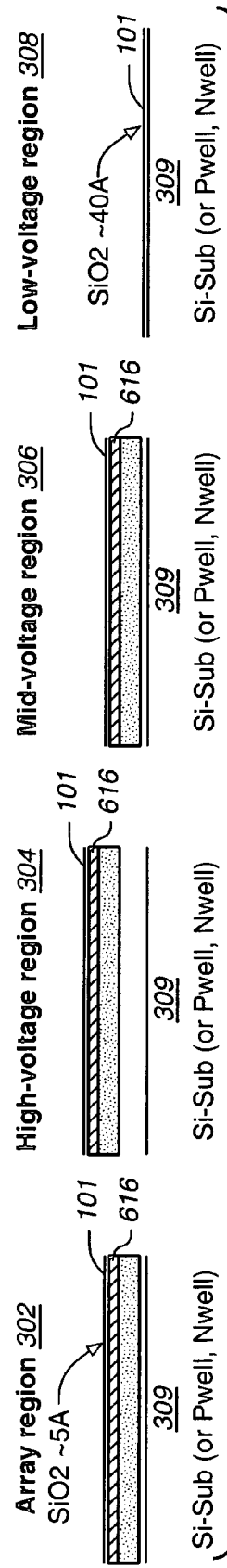
FIG. 10  HF clean (~50A) and Low Voltage Gate Oxidation ~40A
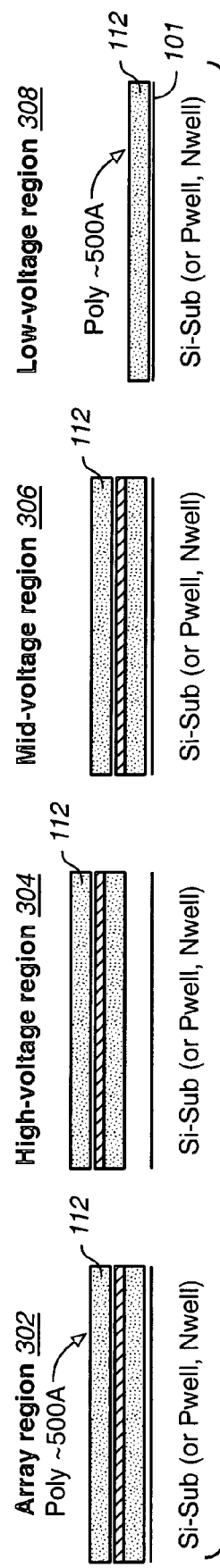
FIG. 11  Poly1-2 deposition (Non-dope)

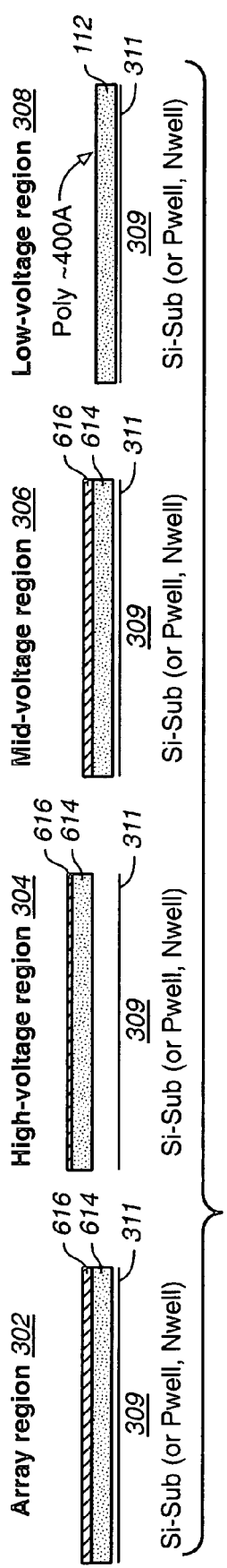
FIG. 12 Poly CMP (~500A Stop at SiN)
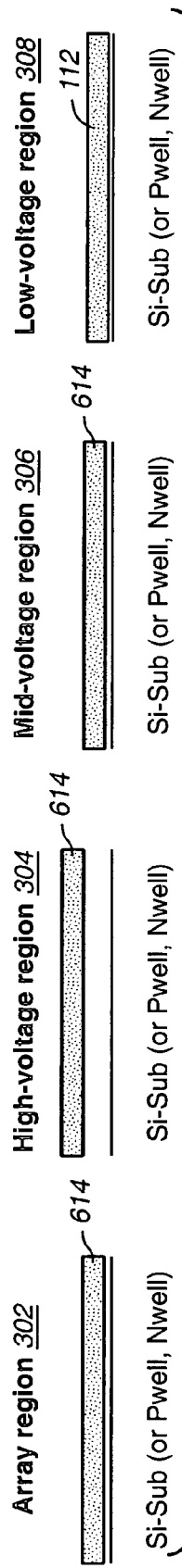
FIG. 13 HF (~10A) + H2PO4
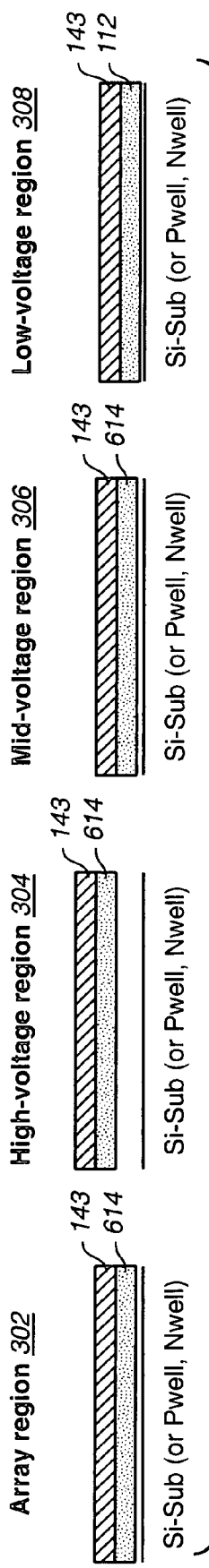
FIG. 14 2nd SiN Deposition SiN (700A)

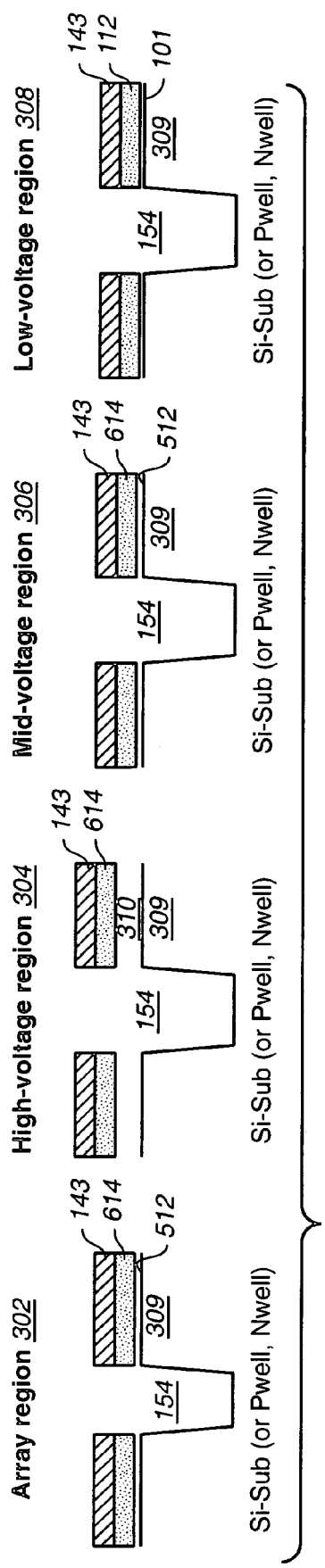
FIG. 15  Active Area Mask and Etch (SiN ~700A/Poly ~500A/SiO2 ~500A/Si-sub ~2000)
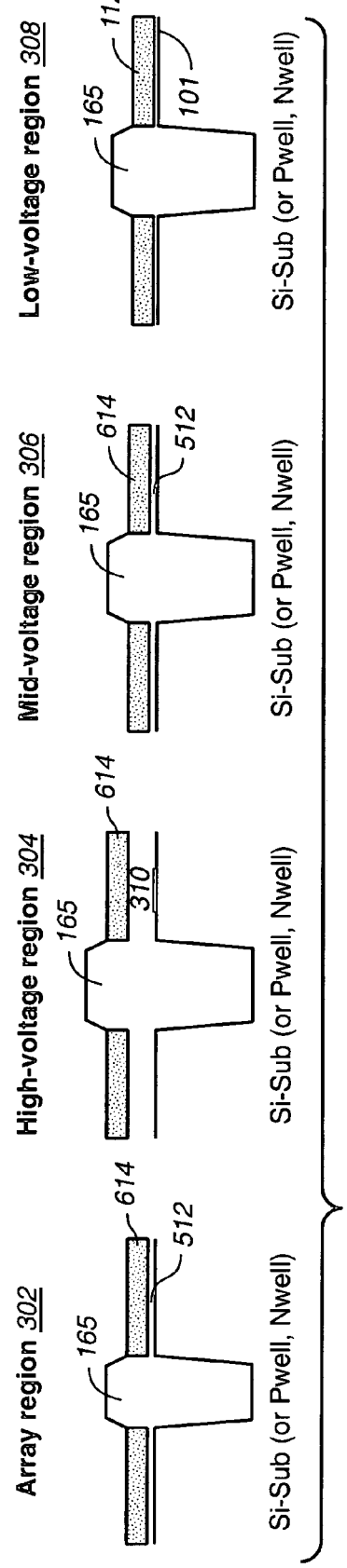
FIG. 16  Liner Ox, HDP depo, CMP, SiN Strip (Normal flow)

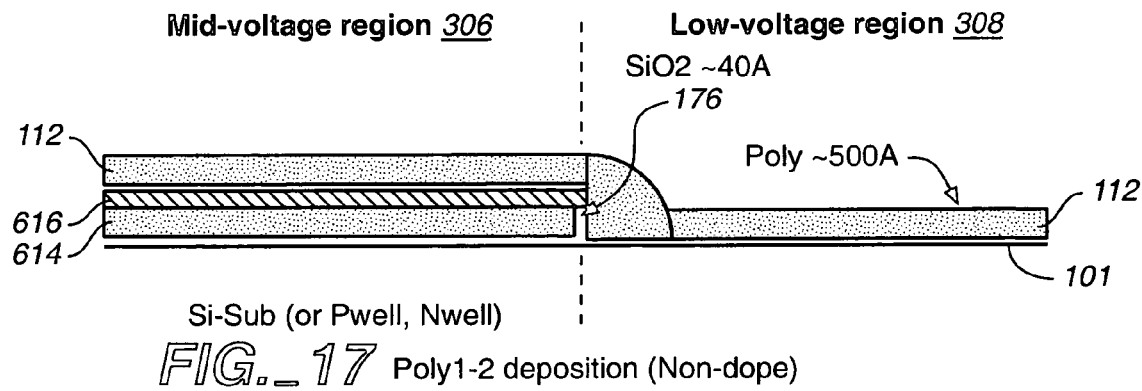
FIG._17 Poly1-2 deposition (Non-dope)
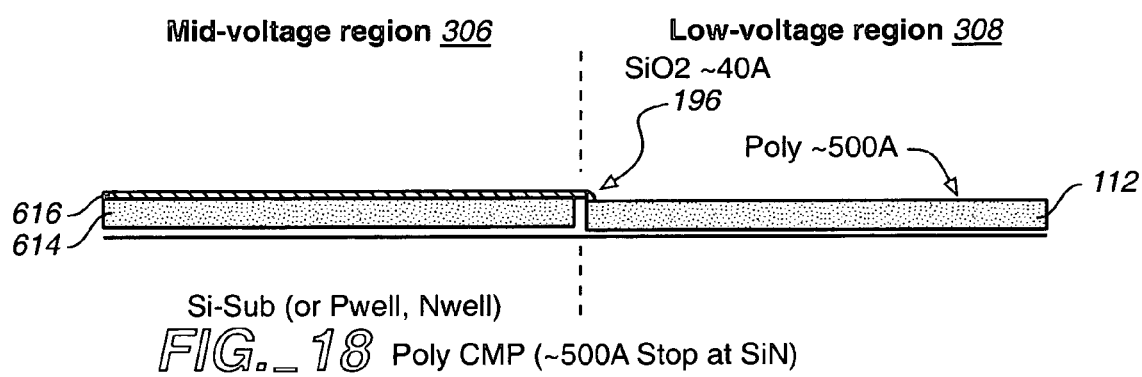
FIG._18 Poly CMP (~500A Stop at SiN)
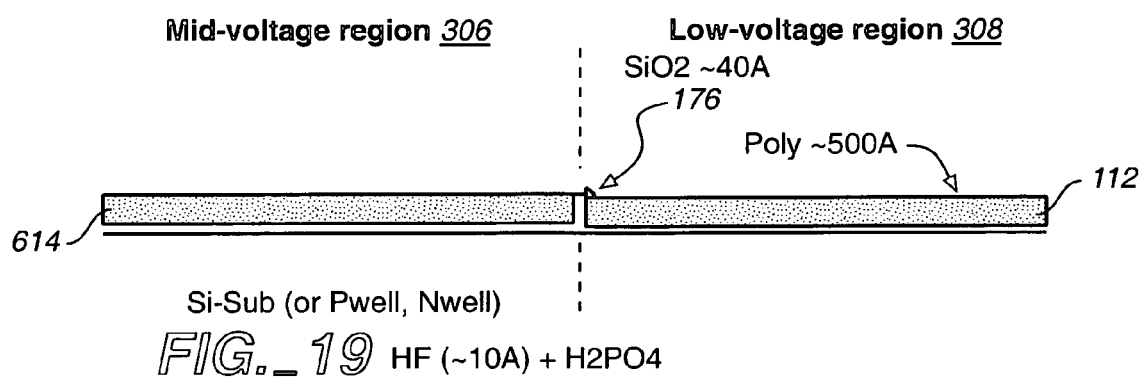
FIG._19 HF (~10A) + H2PO4
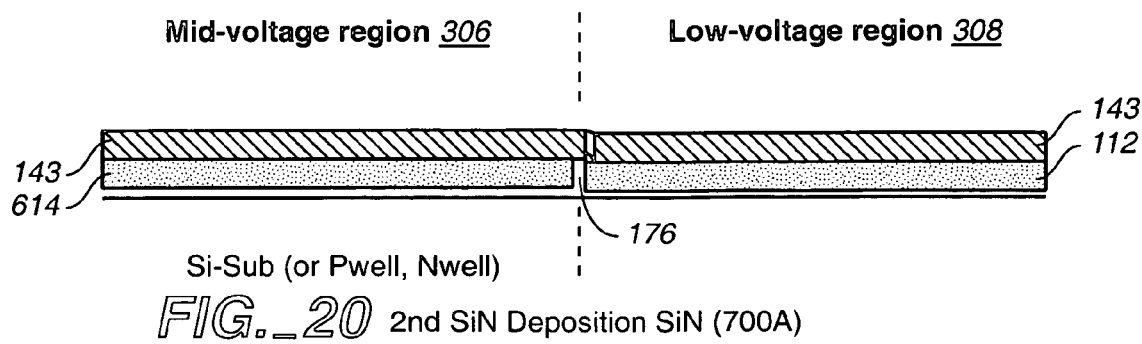
FIG._20 2nd SiN Deposition SiN (700A)

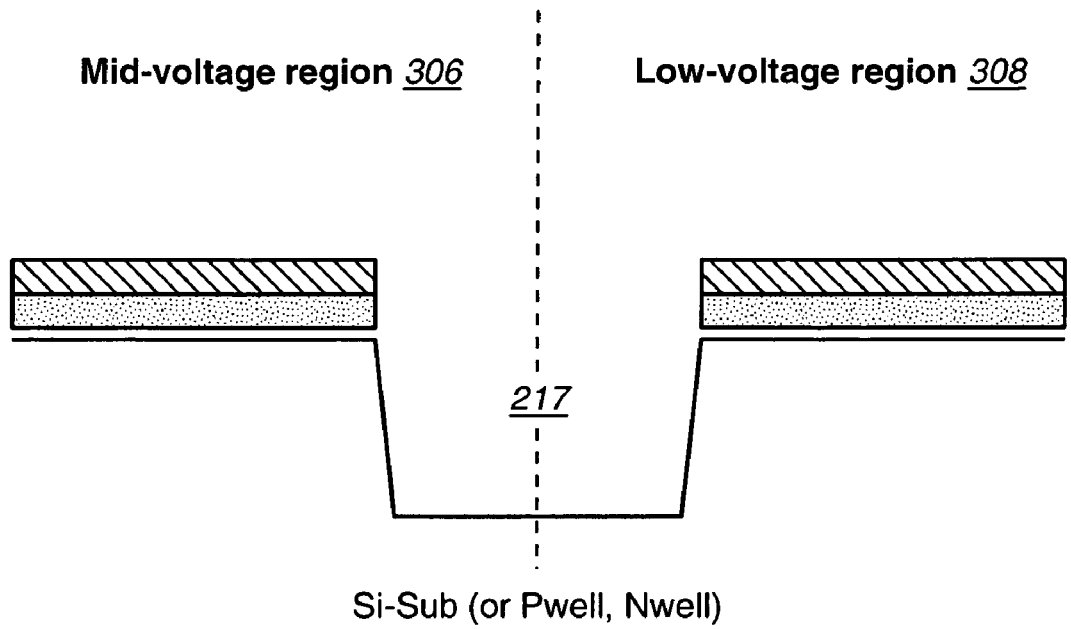
FIG._21 Active Area Mask and Etch
(SiN ~700A/Poly ~500A/SiO2 ~500A/Si-sub ~2000)
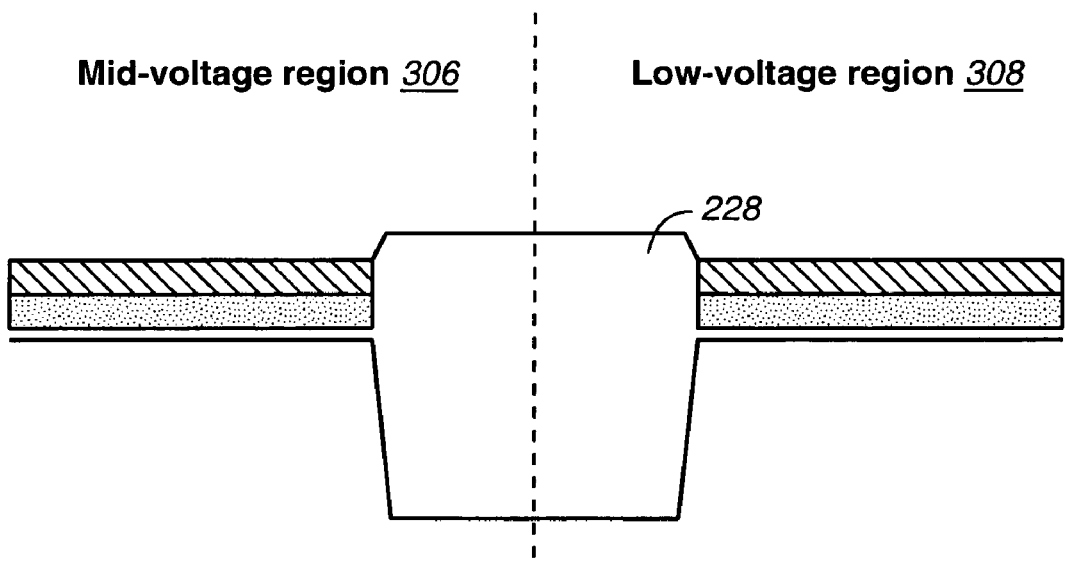
FIG._22 Liner Ox, HDP depo, CMP, SiN Strip (Normal flow)

MULTI-THICKNESS DIELECTRIC FOR SEMICONDUCTOR MEMORY

BACKGROUND

This invention relates generally to non-volatile flash memory systems, and, more specifically to the structures of memory systems, and to the process of forming them.

There are many commercially successful non-volatile memory products being used today, particularly in the form of small form factor cards, which use an array of flash EEPROM (Electrically Erasable and Programmable Read Only Memory) cells. Such cards may be interfaced with a host, for example, by removably inserting a card into a card slot in a host. Some of the commercially available cards are Compact-Flash™ (CF) cards, MultiMedia cards (MMC), Secure Digital (SD) cards, Smart Media cards, personnel tags (P-Tag) and Memory Stick cards. Hosts include personal computers, notebook computers, personal digital assistants (PDAs), various data communication devices, digital cameras, cellular telephones, portable audio players, automobile sound systems, and similar types of equipment. An example of a memory card in communication with a host is shown in FIG. 1. The memory card includes a controller and multiple memory units. In some examples just one memory unit is used in a memory card. The memory units and the controller may be formed on the same chip or may be formed on separate chips that are connected together in the memory card. Alternatively, memory systems may be embedded in a larger system such as a personal computer.

A more detailed view of a memory unit such as those of FIG. 1 is shown in FIG. 2. This shows the memory cell array and peripheral circuits. These peripheral circuits are formed on the same substrate as the memory array. Various types of memory array are used. In one type of architecture, a NAND array, a series of strings of more than two memory cells, such as 16 or 32, are connected along with one or more select transistors between individual bit lines and a reference potential to form columns of cells. Word lines extend across cells within a large number of these columns. An individual cell within a column is read and verified during programming by causing the remaining cells in the string to be over driven so that the current flowing through a string is dependent upon the level of charge stored in the addressed cell. An example of a NAND architecture array and its operation as part of a memory system is found in U.S. Pat. No. 6,046,935, which patent is incorporated herein in its entirety by this reference.

In another type of array having a "split-channel" between source and drain diffusions, the floating gate of the cell is positioned over one portion of the channel and the word line (also referred to as a control gate) is positioned over the other channel portion as well as over the floating gate. This effectively forms a cell with two transistors in series, one (the memory transistor) with a combination of the amount of charge on the floating gate and the voltage on the word line controlling the amount of current that can flow through its portion of the channel, and the other (the select transistor) having the word line alone serving as its gate. The word line extends over a row of floating gates. Examples of such cells, their uses in memory systems and methods of manufacturing them are given in U.S. Pat. Nos. 5,070,032, 5,095,344, 5,315, 541, 5,343,063, 5,661,053, and 6,281,075, which patents are incorporated herein by this reference in their entirety.

A modification of this split-channel flash EEPROM cell adds a steering gate positioned between the floating gate and the word line. Each steering gate of an array extends over one column of floating gates, perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the floating gate to a desired level through an electric field (capacitive) coupling between the word line and the floating gate. It is often difficult to perform both of these functions in an optimum manner with a single voltage. With the addition of the steering gate, the word line need only perform function (1), while the added steering gate performs function (2). The use of steering gates in a flash EEPROM array is described, for example, in U.S. Pat. Nos. 5,313,421 and 6,222,762, which patents are incorporated herein by this reference.

In any of the types of memory cell arrays described above, the floating gate of a cell is programmed by injecting electrons from the substrate to the floating gate. This is accomplished by having the proper doping in the channel region and applying the proper voltages to the source, drain and remaining gate(s).

Two techniques for removing charge from floating gates to erase memory cells are used in the three types of memory cell arrays described above. One is to erase to the substrate by applying appropriate voltages to the source, drain and other gate(s) that cause electrons to tunnel through a portion of a dielectric layer between the floating gate and the substrate. The other erase technique is to transfer electrons from the floating gate to another gate through a tunnel dielectric layer positioned between them. In the second type of cell described above, a third erase gate is provided for that purpose. In the third type of cell described above, which already has three gates because of the use of a steering gate, the floating gate is erased to the word line, without the necessity to add a fourth gate. Although this latter technique adds back a second function to be performed by the word line, these functions are performed at different times, thus avoiding the necessity of making a compromise because of the two functions. When either erase technique is utilized, a large number of memory cells are grouped together for simultaneous erasure, in a "flash." In one approach, the group includes enough memory cells to store the amount of user data stored in a disk sector, namely 512 bytes, plus some overhead data. In another approach, each group contains enough cells to hold several thousand bytes of user data, equal to many disk sectors' worth of data. Multi-block erasure, defect management and other flash EEPROM system features are described in U.S. Pat. No. 5,297,148, which patent is incorporated herein by this reference.

As in most integrated circuit applications, the pressure to shrink the silicon substrate area required to implement some integrated circuit function also exists with flash EEPROM systems. It is continually desired to increase the amount of digital data that can be stored in a given area of a silicon substrate, in order to increase the storage capacity of a given size memory card and other types of packages, or to both increase capacity and decrease size. One way to increase the storage density of data is to store more than one bit of data per memory cell. This is accomplished by dividing a window of a floating gate charge level voltage range into more than two states. The use of four such states allows each cell to store two bits of data, eight states stores three bits of data per cell, and so on. A multiple state flash EEPROM structure and operation is described in U.S. Pat. Nos. 5,043,940 and 5,172,338, which patents are incorporated herein by this reference.

In these and other types of non-volatile memories, the amount of field coupling between the floating gates and the control gates passing over them is carefully controlled. The amount of coupling determines the percentage of a voltage placed on the control gate that is coupled to its floating gates. The percentage coupling is determined by a number of factors including the amount of surface area of the floating gate that overlaps a surface of the control gate. It is often desired to maximize the percentage coupling between the floating and control gates by maximizing the amount of overlapping area. One approach to increasing coupling area is described by Yuan et al in U.S. Pat. No. 5,343,063, which patent is incorporated herein in its entirety by this reference. The approach described in that patent is to make the floating gates thicker than usual to provide large vertical surfaces that may be coupled with the control gates. The approach described in that patent is to increase coupling between the floating and control gates by adding a vertical projection to the floating gate.

Increased data density can also be achieved by reducing the physical size of the memory cells and/or the overall array. Shrinking the size of integrated circuits is commonly performed for all types of circuits as processing techniques improve over time to permit implementing smaller feature sizes. But there are usually limits of how far a given circuit layout can be shrunk in this manner, since there is often at least one feature that is limited as to how much it can be shrunk, thus limiting the amount that the overall layout can be shrunk. When this happens, designers will turn to a new or different layout or architecture of the circuit being implemented in order to reduce the amount of silicon area required to perform its functions. The shrinking of the above-described flash EEPROM integrated circuit systems can reach similar limits.

One way to form small cells is to use a self-aligned shallow trench isolation (STI) technique. This uses STI structures to isolate adjacent strings of floating gate cells. According to this technique, a tunnel dielectric layer and floating gate polysilicon layer are formed first. Next, STI structures are formed by etching the layers and the underlying substrate to form trenches. The portions of the layers between STI structures are defined by the STI structures and are therefore self-aligned to the STI structures. Typically, the STI structures have a width that is equal to the minimum feature size that can be produced with the processing technology used. The portions of the layers between STI regions may also have a width that is equal to the minimum feature size. These strips are further formed into individual floating gates in later steps.

The gate dielectric of a semiconductor device is important to the function of the device. A gate dielectric layer separates a gate from a channel region of a transistor. In a memory array having data stored in floating gates, the floating gates are separated from the underlying substrate by a gate dielectric. Silicon dioxide ($SiO_2$ or "oxide") is a conventional material for gate dielectric layers. Other gate dielectric structures may be used including an oxide-nitride-oxide (ONO) stack. In certain configurations, electrons may tunnel through this gate dielectric to charge the floating gate and so, the gate dielectric acts as a tunnel oxide. Other devices in a flash memory array, such as select transistors in a NAND array, may have a gate dielectric separating a gate that is not floating from the substrate. Gate dielectric layers in devices are generally limited in thickness according to the voltage that is to be applied across the dielectric. It is generally desirable to have a thin gate dielectric layer to improve device performance. However, if the gate dielectric layer is too thin, it may break down when a high voltage is applied across it. Therefore, the gate dielectric layer is designed to be thick enough to withstand the highest voltage that it is expected to endure.

Memory cell arrays may be formed on the same silicon substrate with other circuits to form a memory system. For example, peripheral circuits may be formed on the same chip as the memory array to form a memory unit as shown in FIG. 2. Peripheral circuits may include charge pumps, sense amplifiers, input/output circuits, row decode circuits, clock circuits, registers and logic circuits. Some components may handle higher voltages than others. For example, charge pumps may produce voltages of 20 volts, while logic circuits may only deal with voltages of 1.5 volts. Therefore, the gate dielectric thicknesses required for devices in these components may be different. A charge pump may require a much thicker gate dielectric layer than a logic circuit. Thus, in some examples of memory systems formed on a semiconductor substrate, it may be desirable to form oxide layers of different thicknesses on different regions of the substrate. Circuits may be divided into high-voltage, mid-voltage and low-voltage circuits. In NAND systems, operations may include read, program and erase. A read operation may be performed using less than 5 volts and may be managed by a low-voltage or mid-voltage circuit. A program operation may use approximately 20 volts for programming (using high-voltage circuits) and approximately 7 volts for inhibiting (using mid-voltage circuits). An erase operation may use approximately 20 volts (using high-voltage circuits). In peripheral circuits, it is desirable to use thin gate oxide, particularly for logic operation. FIG. 2 shows a low-voltage region that includes peripheral circuits including logic and input/output (I/O) circuits. A mid-voltage region includes a read pump (a charge pump used for generating voltages used for reading). A high-voltage region includes two charge pumps used during programming. In addition, a memory cell array may be treated as a separate region. Adjacent to the memory cell array are the row decoder and sense amplifier (S/A) circuits. The row-decoder is typically in a high-voltage region while sense amplifiers may be in a low-voltage region.

The tunnel oxide layer that separates the floating gate from the underlying substrate is generally an extremely sensitive part of the memory array. Defects in this layer may cause problems for cell reliability such as endurance problems or data retention problems. After the tunnel oxide layer is formed, it is preferable to protect the layer from damage during the formation of subsequent layers. This may include protection from chemical or physical damage to the tunnel oxide layer.

Therefore, there is a need for a process that provides the advantages of a self-aligned STI process for a memory array formed on a substrate and also provides dielectric layers of multiple thicknesses for different devices on the substrate and protects the memory array dielectric layer from damage from subsequent process steps.

SUMMARY

A process is provided in which gate dielectric layers are formed such that different regions of a substrate have different gate dielectric layer thicknesses. A memory array region has a thin tunnel oxide, while some high-voltage peripheral circuits have thick oxide. Some peripheral circuits, in a mid-voltage region, may use the same oxide thickness as the memory array. Some peripheral circuits, in a low-voltage region, may use a gate dielectric that is thinner than that of the tunnel oxide of the memory array. The tunnel oxide is covered by a first polysilicon layer after it is formed. Thus, the tunnel oxide is protected from damage from subsequent process steps by the overlying polysilicon layer. Subsequent to forming the multiple gate dielectric layers, STI structures are formed that separate previous layers into strips from which individual floating gates are formed. In this way, STI regions and floating gates are self-aligned and may have dimensions that are the minimum dimensions allowed by the patterning process.

A thick oxide is formed across the substrate and then removed from regions other than the high-voltage regions. Subsequently, a tunnel oxide layer is formed, followed by a first polysilicon layer that is later used to form floating gates. The tunnel oxide and first polysilicon layer are removed in a low-voltage region, leaving the tunnel oxide and polysilicon in an array region and a mid-voltage region. A thin oxide is then formed in the low-voltage region and a second polysilicon layer is formed over it. This second polysilicon layer is subsequently removed from all regions except the low-voltage region. Thus, three thicknesses of oxide are provided in the four regions and each oxide has a polysilicon layer overlying it. Subsequently, STI structures are formed by etching trenches and filling them with oxide. An STI structure may be formed at an interface between regions where irregularities in topology may cause problems. The interface, and any defects occurring there, is removed as part of the STI formation.

BRIEF DESCRIPTION OF THE DRAWINGS

FIG. 1 shows a memory card having multiple memory units;

FIG. 2 shows a memory unit of FIG. 1;

FIG. 3 shows formation of a first gate oxide layer across the surface of a substrate, the surface of the substrate having an array region, a high-voltage region, a mid-voltage region and a low-voltage region;

FIG. 4 shows the removal of the first gate oxide layer of FIG. 1 from the array region, mid-voltage region and low-voltage region;

FIG. 5 shows the formation of a second gate oxide layer across the four regions of FIG. 4;

FIG. 6 shows the formation of a first polysilicon layer and a first nitride layer across the four regions of FIG. 5;

FIG. 7 shows the removal of the first polysilicon layer and the first nitride layer of FIG. 6 in the low-voltage region;

FIG. 8 shows the formation of a sacrificial oxide layer in the low-voltage region after the removal of the first nitride layer of FIG. 7.

FIG. 9 shows implantation in the low-voltage region through the sacrificial oxide layer shown in FIG. 8;

FIG. 10 shows the substrate after removal of the sacrificial oxide of FIG. 9 and the formation of third gate oxide layer across the substrate;

FIG. 11 shows the deposition of a second polysilicon layer over the third gate oxide layer of FIG. 10;

FIG. 12 shows the removal of portions of the second polysilicon layer of FIG. 11 from the array region, high-voltage region and mid-voltage region;

FIG. 13 shows the substrate of FIG. 12 after removal of the first nitride layer from the array region, high-voltage region and mid-voltage region;

FIG. 14 shows the substrate of FIG. 13 after formation of a second nitride layer across all four regions;

FIG. 15 shows the substrate of FIG. 14 after formation of trenches through the layers covering the substrate and into the substrate;

FIG. 16 shows the substrate of FIG. 15 after the trenches are filled with oxide and the second nitride layer is removed leaving STI structures;

FIG. 17 shows a boundary between a mid-voltage region and a low-voltage region after formation of the second polysilicon layer of FIG. 11;

FIG. 18 shows the boundary of FIG. 17 after removal of the second polysilicon layer from the mid-voltage region as in FIG. 12;

FIG. 19 shows the boundary of FIG. 18 after removal of the first nitride layer from the mid-voltage region as in FIG. 13;

FIG. 20 shows the boundary of FIG. 19 after formation of the second nitride layer of FIG. 14;

FIG. 21 shows the boundary of FIG. 20 after removal of material to form a trench at the boundary;

FIG. 22 shows the boundary of FIG. 21 after the trench is filled with oxide to form an STI structure isolating the mid-voltage region from the low-voltage region.

DETAILED DESCRIPTION

In one embodiment of the present invention, a memory unit is formed on a substrate surface that has four regions. A controller may be formed on the same substrate or on a separate substrate. A memory unit may include a NAND flash memory array. A memory array is formed having a self-aligned NAND structure. Examples of forming such structures are provided in U.S. Patent Publication No. 2005/0199939-A1, entitled "Self Aligned Non-Volatile Memory Cells and Processes for Fabrication," filed on Mar. 12, 2004; U.S. Pat. No. 6,894,930, entitled, "Deep Wordline Trench to Shield Cross Coupling Between Adjacent Cells for Scaled NAND,"; U.S. Pat. No. 6,898,121, and U.S. patent application Ser. No. 11/021,693, filed Dec. 22, 2004, entitled, "Low-voltage, multiple thin-gate oxide and low-resistance gate electrode," which patent applications are hereby incorporated by reference in their entirety. Different regions require gate dielectric of different thickness. The regions include the memory array region, a high-voltage region, a mid-voltage region and a low-voltage region. A region includes a particular portion of the substrate and the structures formed on it. In each region, the substrate may be the silicon substrate without additional doping, or it may have P-well or N-well structures formed. In this example, the mid-voltage region is a peripheral region that has circuits that are exposed to voltages that are similar to those experienced by the gate dielectric of the memory array. Therefore, the same gate dielectric thickness may be used for the mid-voltage region as is used for the memory array. Thus, the four regions use three different oxide thicknesses. The invention is not restricted to any particular number of regions, however. More than four thicknesses of oxide may be used. Also, only one region of each type (high, mid, and low-voltage) is shown in FIG. 3, but a memory unit may have multiple regions of a particular type. For example, there may be several high-voltage regions, several mid-voltage regions and several low-voltage regions in a memory unit. A memory unit may have several memory arrays. A memory unit is generally a single silicon chip. A chip is formed by dividing a silicon wafer that has been processed to form circuits. Thus, during processing, many memory units are formed on a single substrate.

FIGS. 3-16 show the formation of different dielectric layers of different thicknesses across the four regions and subsequent formation of self-aligned STI regions. FIGS. 3-16 show the four regions at intermediate stages of formation in the order in which they occur during fabrication.

FIG. 3 shows a memory system in an intermediate stage of fabrication. A substrate 309 may be an N-type or P-type substrate, formed by CZ, MCZ or other method. An epitaxial silicon layer may be grown on the surface of the substrate. Typically, a substrate having a <100> orientation is used. A sacrificial oxide layer may be grown and subsequently removed to reduce contamination at the surface. A hydrogen anneal may also be used. The memory system has an array region 302 and three peripheral regions, high-voltage region 304, mid-voltage region 306 and low-voltage region 308. A first dielectric layer 310 is formed on the surface 311 of a substrate 309 in each of four regions, array region 302, high-voltage region 304, mid-voltage region 306 and low-voltage region 308. The first dielectric layer 310 is silicon dioxide ($SiO_2$, or "oxide") of 350 angstroms thickness. First dielectric layer 310 may be formed by oxidation, for example, in a furnace oxidation step. Alternatively, other dielectric material could be used as a gate dielectric and chemical vapor deposition could be used to form the dielectric layer.

FIG. 4 shows the removal of portions of first dielectric layer 310 in the array region 302, mid-voltage region 306 and low-voltage region 308. A portion of first dielectric layer 310 in high-voltage region 304 remains. This selective removal may be achieved by applying a layer of photoresist, patterning the layer of photoresist, and removing portions of the photoresist layer over array region 302, mid-voltage region 306 and low-voltage region 308. An etch may then be performed with the photoresist portion over high-voltage region 304 acting as an etch mask. The etch may be a wet etch using hydrofluoric acid (HF). Photoresist is subsequently removed.

FIG. 5 shows the formation of a second dielectric layer 512. Second dielectric layer 512 is thinner than first dielectric layer 310 (80 Angstroms, compared with 350 Angstroms). In the example shown, second dielectric layer 512 is formed of silicon dioxide, by oxidation of the exposed surfaces of array region 302, mid-voltage region 306 and low-voltage region 308. High-voltage region 304 is also further oxidized during formation of second dielectric layer 512 so that first dielectric layer 310 in this area becomes thicker, going from 350 Angstroms thickness to approximately 400 Angstroms thickness. The formation of second dielectric layer 512 may be done as a three-step process including a base oxidation step, a nitridation step and a reoxidation step to provide nitrided oxide. The base oxidation step forms approximately 80 Angstroms of silicon dioxide by oxidation in a furnace or by rapid thermal oxidation. The nitridation step subsequently introduces nitrogen into the silicon dioxide to reduce the risk of breakdown of the oxide when a voltage is applied across it. Nitridation may be achieved in a furnace or using rapid thermal nitridation. The reoxidation step reduces the amount of Nitrogen in the silicon dioxide layer to avoid excessive Nitrogen. The reoxidation step also grows an additional layer of approximately 5-10 Angstroms of silicon dioxide.

FIG. 6 shows a polysilicon layer ("poly1-1") 614 and a silicon nitride (SiN, or "nitride") layer 616 formed across the substrate 309. Polysilicon layer 614 and silicon nitride layer 616 overlie first dielectric layer 310 in the high-voltage region and second dielectric layer 512 in regions 302, 306, 308. Polysilicon layer 614 may be formed as an undoped layer. Both polysilicon layer 614 and nitride layer 616 may be formed in a furnace. Polysilicon layer 614 may be about 350 Angstroms thick. Silicon nitride layer 616 may be about 200 Angstroms thick.

FIG. 7 shows the removal of nitride layer 616 and polysilicon layer 614 in low-voltage region 308. The removal of these layers in this area may be achieved by masking the other regions 302, 304, 306 using a patterned photoresist layer and then etching low-voltage region 308. Nitride layer 616 and polysilicon layer 614 may be removed using a dry etch process. Both layers may be removed in the same etch process in the same etching system. Second dielectric layer 512 may be removed using a 100 Angstrom HF wet etch, thus over-etching the approximately 80 Angstroms of oxide of second dielectric layer 512. However, because of the nitrogen in second dielectric layer 512, some nitrogen residue may remain after second dielectric layer 512 is removed.

FIG. 8 shows the formation of a sacrificial oxide layer 720 across the four regions 302, 304, 306, 308 of substrate 309. Formation of sacrificial oxide layer 720 oxidizes the nitrogen that is present in the low-voltage region 308. Sacrificial oxide layer 720 containing this nitrogen is approximately 30 Angstroms thick in low-voltage region 308. In the other regions 302, 304, 306, sacrificial oxide layer 720 is approximately 5 Angstroms thick and is formed by oxidation of silicon nitride layer 616.

FIG. 9 shows the implantation of low-voltage region 308. This is referred to as a threshold voltage (Vt) implant because it affects the threshold voltage of the transistors formed in the region. The implanted impurities may be chosen to form either N-channel ("Nch") or P-channel ("Pch") transistors. The implant step is carried out with sacrificial oxide layer 720 in place. Thus, sacrificial oxide layer 720 serves as a buffer layer for the threshold voltage implant step.

FIG. 10 shows the structure of FIG. 9 after a clean step and an oxidation step. Hydrofluoric acid (HF) is used to clean the substrate. This removes oxide layer 720 from across substrate 309. After this step, substrate 309 is exposed in the low-voltage region 308. Next, an oxidation step is performed to grow a gate oxide layer 101 of approximately 40 Angstroms in low-voltage region 308. Gate oxide layer 101 serves as the gate dielectric for low-voltage region 308. This step also produces gate oxide layer 101 of approximately 5 Angstroms in the other three regions 302, 304, 306, due to oxidation of nitride layer 616.

FIG. 11 shows the formation of a second polysilicon layer 112 ("Poly1-2") across the four regions 302, 304, 306, 308, of the substrate 309. Second polysilicon layer 112 is approximately 500 Angstroms thick and sacrificial overlies gate oxide layer 101 of low-voltage region 308.

FIG. 12 shows the removal of portions of second polysilicon layer 112 and gate oxide layer 101 that overlie the array region 302, high-voltage region 304 and mid-voltage region 306, while leaving most of second polysilicon layer 112 in the low voltage region 308. This may be achieved by chemical mechanical polishing (CMP). Because second polysilicon layer 112 overlying array region 302, high-voltage region 304 and mid-voltage region 306 overlies first polysilicon layer 614 and nitride layer 616, it extends higher from surface 311 of substrate 309 and is removed during this planarization step. Second polysilicon layer 112 in low-voltage region 308 is lower and so is only partially removed (reduced from approximately 500 Angstroms to approximately 400 Angstroms thickness). Portions of nitride layer 616 in array region 302, high voltage region 304 and mid-voltage region 306 may also be removed during this step. However, at least some of nitride layer 616 remains to cover first polysilicon layer 614 in these regions at this point.

FIG. 13 shows the structure of FIG. 12 after removal of nitride layer 616. Nitride layer 616 may be removed using hydrofluoric acid (HF) and phosphoric acid (H2PO4). This removal leaves the polysilicon layers 614, 112 intact.

FIG. 14 shows the formation of a second nitride layer 143 across all four regions 302, 304, 306, 308. Second nitride layer 143 is approximately 700 Angstroms in thickness.

FIG. 15 shows the formation of shallow trench isolation (STI) trenches 154 in all four regions 302, 304, 306, 308 of substrate 309. STI trenches 154 may not be needed in all regions. However, it is possible to provide them in any region. Forming STI trenches 154 may be achieved by forming an etch mask exposing the areas to be etched. The etch may be a dry etch. For example, a three step etch may remove silicon nitride and polysilicon in a first step, remove silicon dioxide in a second step and remove a portion of the substrate in a third step. STI trench 154 extends through nitride layer 143 (approximately 700 Angstroms), a polysilicon layer 614 or 112 (approximately 500 Angstroms), an oxide layer 512, 310 or 101 (from 40 to 400 Angstroms) and extends approximately 2000 Angstroms into substrate 309.

FIG. 16 shows the formation of STI structures 165. This may be achieved by depositing oxide in STI trenches 154 and over the etched substrate, then using CMP to remove the excess oxide down to the level of the top surface of the nitride layer 143. Subsequently, nitride layer 143 may be removed so that STI structure 165 extends above the level of the top surface of the first polysilicon layer 614 and second polysilicon layer 112.

At a boundary between regions, some irregular features may be formed because of the height difference between features of adjacent regions. FIGS. 17-20 show an interface between mid-voltage region 306 and low-voltage region 308 during intermediate stages of fabrication with irregular features formed.

FIG. 17 shows the interface after deposition of second polysilicon layer 112 as shown in FIG. 11. There is an interface oxide 176 between low-voltage region 308 and mid-voltage region 306 of approximately 40 Angstroms on the side of first polysilicon layer 614 in mid-voltage region 306. Interface oxide 176 is formed during formation of the gate dielectric layer 101 for low-voltage region 308 shown in FIG. 10. When second polysilicon layer 112 is formed, interface oxide 176 separates the two polysilicon layers 614, 112 at the interface.

FIG. 18 shows the interface of FIG. 17 after the CMP step of FIG. 12 that removes second polysilicon layer 112 from mid-voltage region 306. A portion of interface oxide 176 protrudes approximately 40 Angstroms above the surface of second polysilicon layer 112 in low-voltage region 308.

FIG. 19 shows the interface after removal of nitride layer 616 (as shown in FIG. 13), leaving interface oxide 176 protruding approximately 40 Angstroms above second polysilicon layer 112 of low-voltage region 308.

FIG. 20 shows the interface after formation of second nitride layer 143 of FIG. 14. A portion of interface oxide 176 remains between the adjacent regions 306, 308 and a height difference remains between the two regions 306, 308. Interface oxide 176 could cause problems for devices adjacent to this interface because of the uneven nature of the interface and the risk of particles becoming dislodged from the interface and damaging devices.

FIG. 21 shows the interface of FIG. 20 after formation of a trench 217. Forming trench 217 of FIG. 21 involves removal of material including the interface oxide 176 and any other defects that occur at the boundary between mid-voltage region 306 and low-voltage region 308. Trench 217 is similar to trenches 154 of FIG. 15 and may be formed in the same step.

FIG. 22 shows an STI region 228 formed in the same way as the STI structures 165 of FIG. 16 discussed above. STI structure 228 of FIG. 22 is approximately 400 Angstroms wide. A similar STI structure may also be used to isolate mid-voltage region 306 from low-voltage region 308 and eliminate irregularities formed at the interface between these regions. Such an STI structure may also be used to isolate other adjacent regions from each other. For example, high-voltage region 304 may be isolated from mid-voltage region 306, or from low-voltage region 308. Array region 302 may be isolated from other regions by such STI structures also.

In addition to isolating different regions by forming STI structures at the interface, in one example, design rules may prohibit a high-voltage region from being placed adjacent to a low-voltage region. This may reduce the height difference between adjacent regions. Thus, a high-voltage region may be adjacent to a mid-voltage region, and a mid-voltage region may be adjacent to a low-voltage region but a high-voltage and a low-voltage may not be directly adjacent to each other.

Subsequent to the steps shown here, additional steps are performed to produce a final memory array. Additional steps may include patterning the control gate layer to form separate control gates, one or more implant steps and addition of passivation layers.

While the above is a full description of the specific embodiments, various modifications, alternative constructions and equivalents may be used. Therefore, the above description and illustrations should not be taken as limiting the scope of the present invention which is defined by the claims.

It is claimed:

1. A method of forming a non-volatile memory array and array circuits on a surface of a substrate, the array circuits including a high-voltage region and a low-voltage region, the non-volatile memory array having shallow trench isolation structures, comprising:
    forming a first silicon dioxide layer of a first thickness that covers a first plurality of portions of the surface;
    subsequently forming a second silicon dioxide layer of a second thickness across the surface of the substrate including a second plurality of portions of the surface, the second thickness being less than the first thickness;
    forming a first polysilicon layer over the second silicon dioxide layer;
    removing a plurality of portions of the first polysilicon layer and the second silicon dioxide layer to expose a third plurality of portions of the surface;
    forming a third silicon dioxide layer over the third plurality of portions of the surface; and
    subsequently forming the shallow trench isolation structures in the surface.

2. The method of claim 1 wherein the first plurality of portions of the surface are within the high-voltage region and the first silicon dioxide layer forms a high-voltage gate dielectric in the high-voltage region.

3. The method of claim 1 wherein the second plurality of portions are within the memory array.

4. The method of claim 1 wherein the second plurality of portions are in a mid-voltage region.

5. The method of claim 1 wherein the third plurality of portions are within the low-voltage region.

6. The method of claim 1 further comprising forming a first silicon nitride layer overlying the first polysilicon layer and removing a plurality of portions of the first silicon nitride layer in the same pattern as removing the plurality of portions of the first polysilicon layer and the second silicon dioxide layer to expose a third plurality of portions of the surface.

7. The method of claim 6 further comprising forming a second polysilicon layer overlying the first silicon nitride layer.

8. The method of claim 7 further comprising planarizing the second polysilicon layer such that portions of the second polysilicon layer overlying the first and second plurality of portions of the surface are removed and portions of the second polysilicon layer overlying the third plurality of portions of the surface are not removed.

9. The method of claim 8 further comprising removing the first silicon nitride layer and forming a second silicon dioxide layer overlying the second polysilicon layer.

10. The method of claim 1 further comprising implanting a dopant into the third plurality of portions of the surface prior to forming the third silicon dioxide layer.

11. The method of claim 1 wherein the first silicon dioxide layer has a thickness of approximately 350 angstroms, the second silicon dioxide layer has a thickness of approximately 80 angstroms and the third silicon dioxide layer has a thickness of approximately 40 angstroms.

12. The method of claim 1 wherein individual shallow trench isolation structures are formed to replace interface regions between adjacent portions having different silicon dioxide layer thickness.

13. The method of claim 1 wherein the first plurality of portions of the surface are within the high-voltage region;
the second plurality of portions of the surface are within the memory array portion and within a mid-voltage region of the array circuits; and
the third plurality of portions of the surface are within the low voltage region.

14. The method of claim 13 wherein the memory array is a NAND array having shallow trench isolation structures separating adjacent floating gates.

15. The method of claim 1 wherein the second silicon dioxide layer is formed over the first silicon dioxide layer that covers the first plurality of portions of the surface.

16. The method of claim 13 wherein individual shallow trench isolation structures are formed to replace interface regions between adjacent portions having different silicon dioxide layer thickness.

17. The method of claim 13 further comprising forming a conductive layer over the memory array portion, high-voltage portion and low-voltage portion, and planarizing the conductive layer such that portions of the conductive layer overlying the memory array portion and high voltage portion of the surface are removed and portions of the conductive layer overlying the low-voltage portion of the surface are not removed.

* * * * *